United States Patent
Knoot

[19]

[11] Patent Number: 6,130,415
[45] Date of Patent: Oct. 10, 2000

[54] LOW TEMPERATURE CONTROL OF RAPID THERMAL PROCESSES

[75] Inventor: Peter A. Knoot, San Carlos, Calif.

[73] Assignee: Applied Materials, Inc., Santa Clara, Calif.

[21] Appl. No.: 09/296,223

[22] Filed: Apr. 22, 1999

[51] Int. Cl.$^7$ .............................. H05B 1/02; A21B 2/00; G01J 5/00

[52] U.S. Cl. .......................... 219/502; 392/416; 374/121; 250/338.1

[58] Field of Search ................................. 219/497, 501, 219/502; 392/416, 418, 419, 420; 374/121, 124, 126, 129, 130, 131, 132; 250/338.1, 338.3, 338.4, 339.03, 339.04, 339.06, 339.14, 340, 341.1, 341.4, 341.6

[56] References Cited

U.S. PATENT DOCUMENTS

| | | | |
|---|---|---|---|
| 5,061,084 | 10/1991 | Thompson et al. ...................... | 374/127 |
| 5,170,041 | 12/1992 | Amith et al. ............................ | 219/502 |
| 5,180,226 | 1/1993 | Moslehi .................................. | 374/127 |
| 5,641,419 | 6/1997 | Vandenabeele ......................... | 219/501 |
| 5,997,175 | 12/1999 | Champetier et al. .................... | 374/126 |

Primary Examiner—Sang Paik
Attorney, Agent, or Firm—Fish & Richardson

[57] ABSTRACT

An apparatus for processing a semiconductor substrate mounted in a thermal processing chamber includes a heating system for heating the substrate, which includes lamps facing a front side of the substrate and a power supply system providing power to at least one of the lamps with a DC power component and an AC power component at a selected frequency. The AC power component is a selected fraction of the DC power component. The apparatus also has a sensor facing a back side of the substrate for providing a detected signal indicative of measured radiation from the back side of the substrate. A lock-in system provides a lock-in signal indicative of a magnitude of an AC component of the detected signal at the selected frequency in response to the detected signal and a reference signal at the selected frequency. A processing system is adapted to determine a transmitted portion of the measured radiation that is transmitted through the substrate based upon the lock-in signal, the detected signal and the selected fraction.

21 Claims, 4 Drawing Sheets

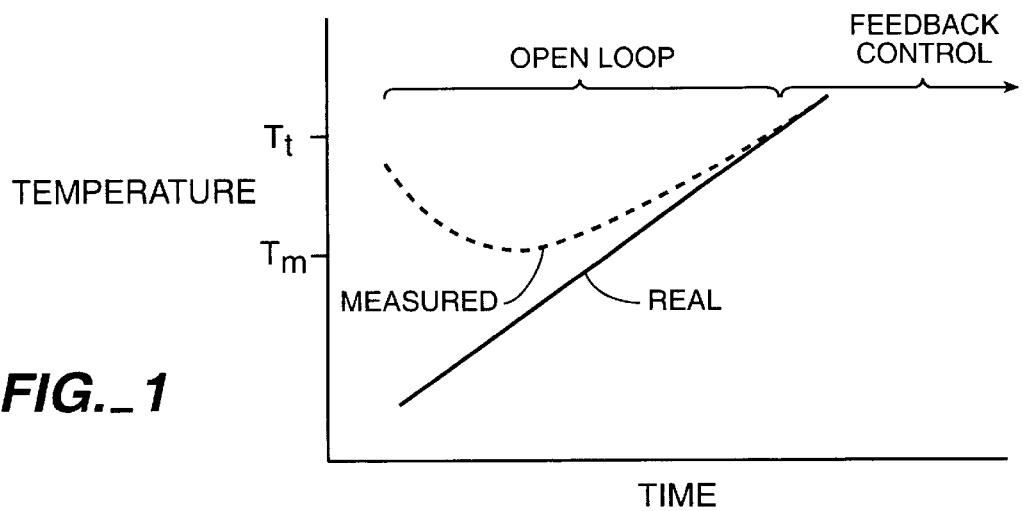
FIG._1
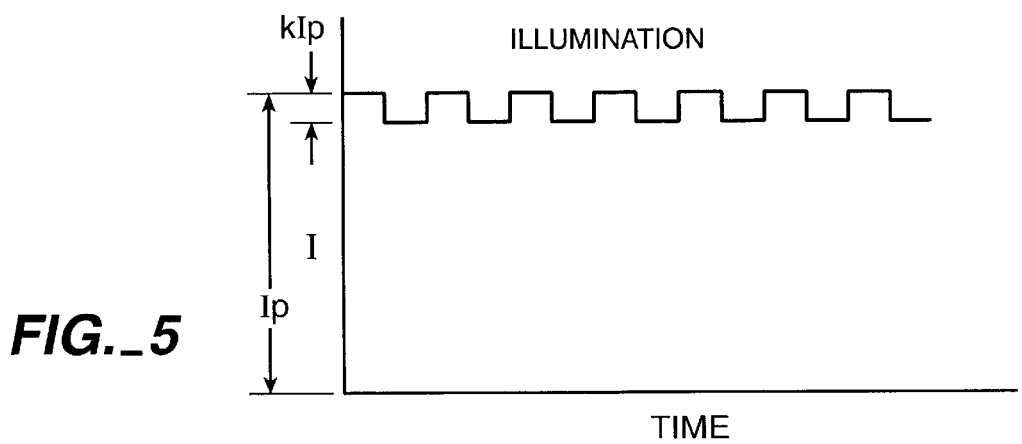
FIG._5
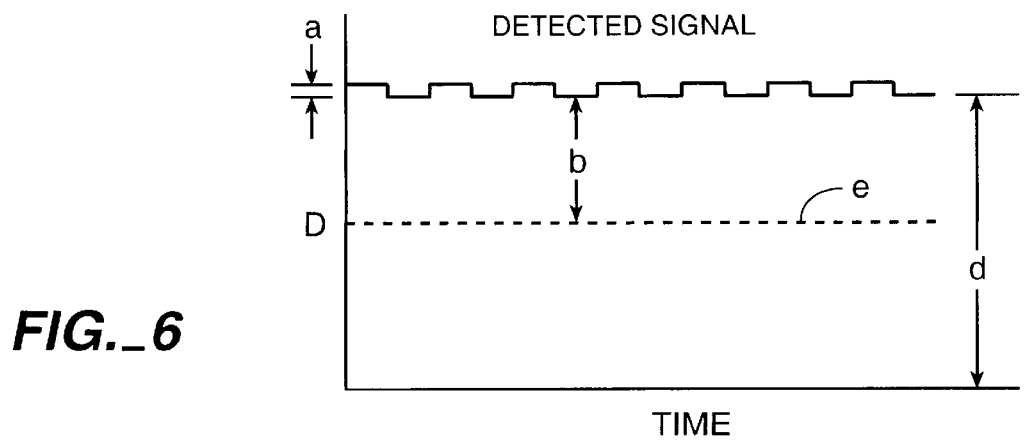
FIG._6

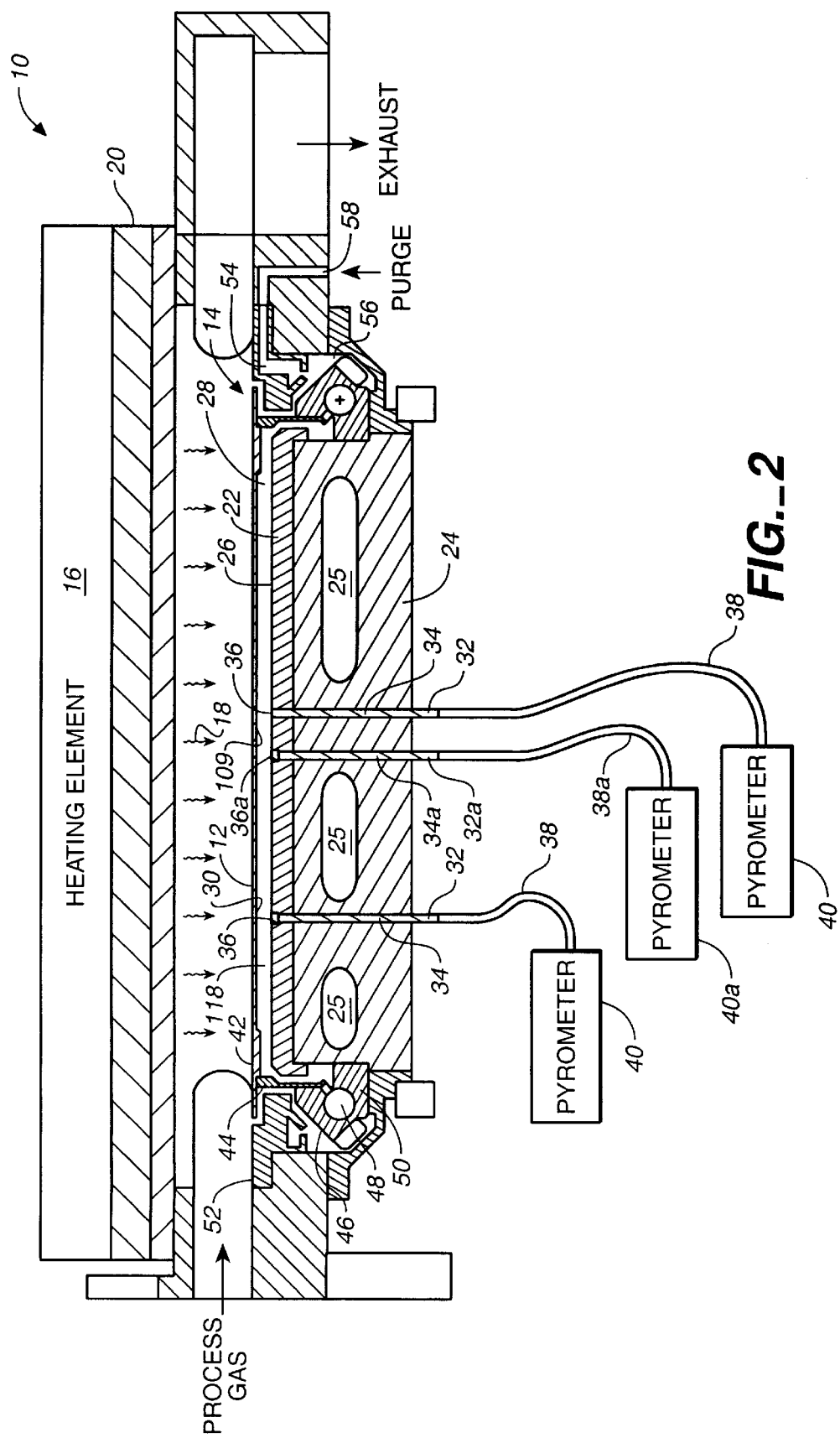
FIG._2

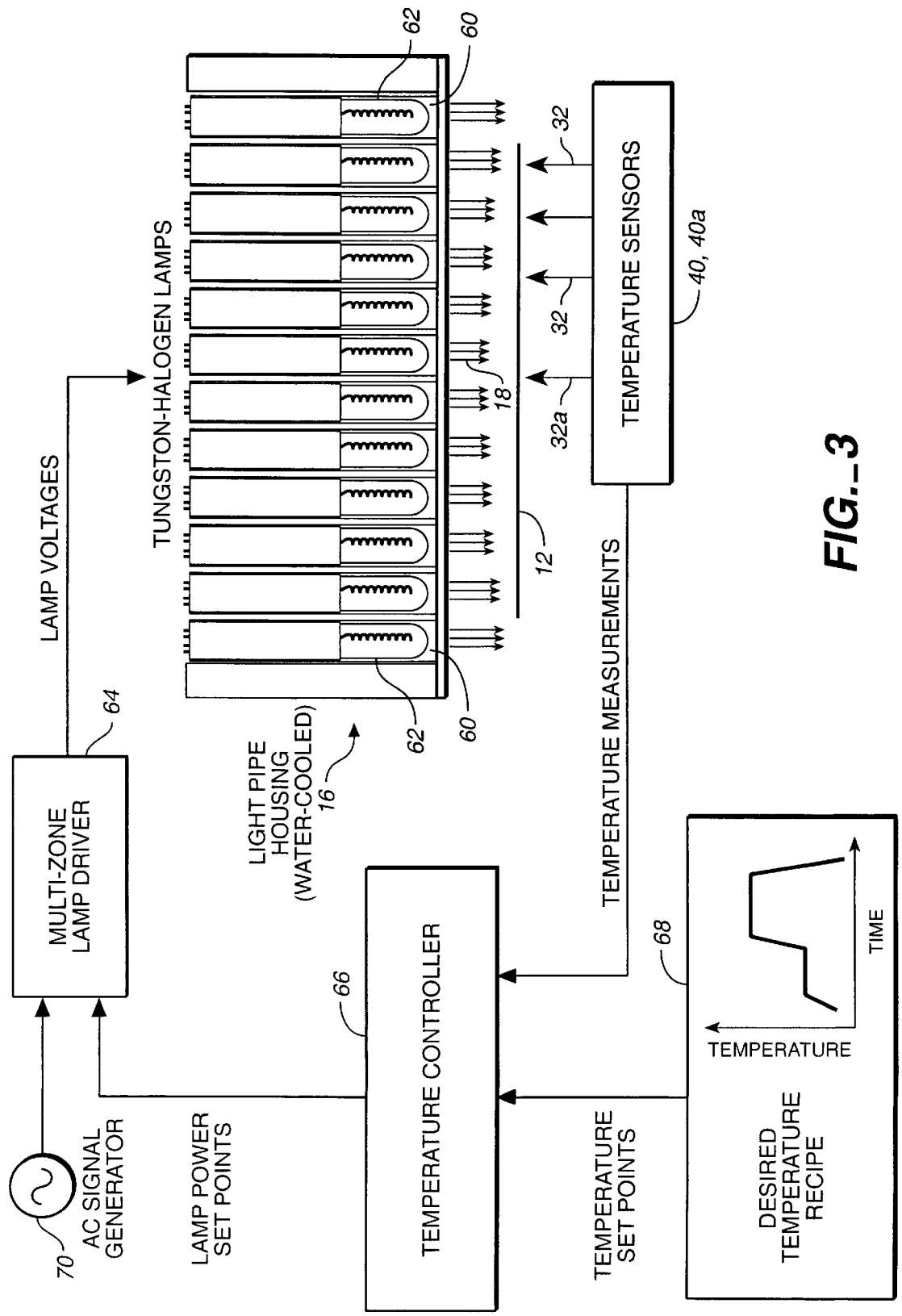
FIG._3

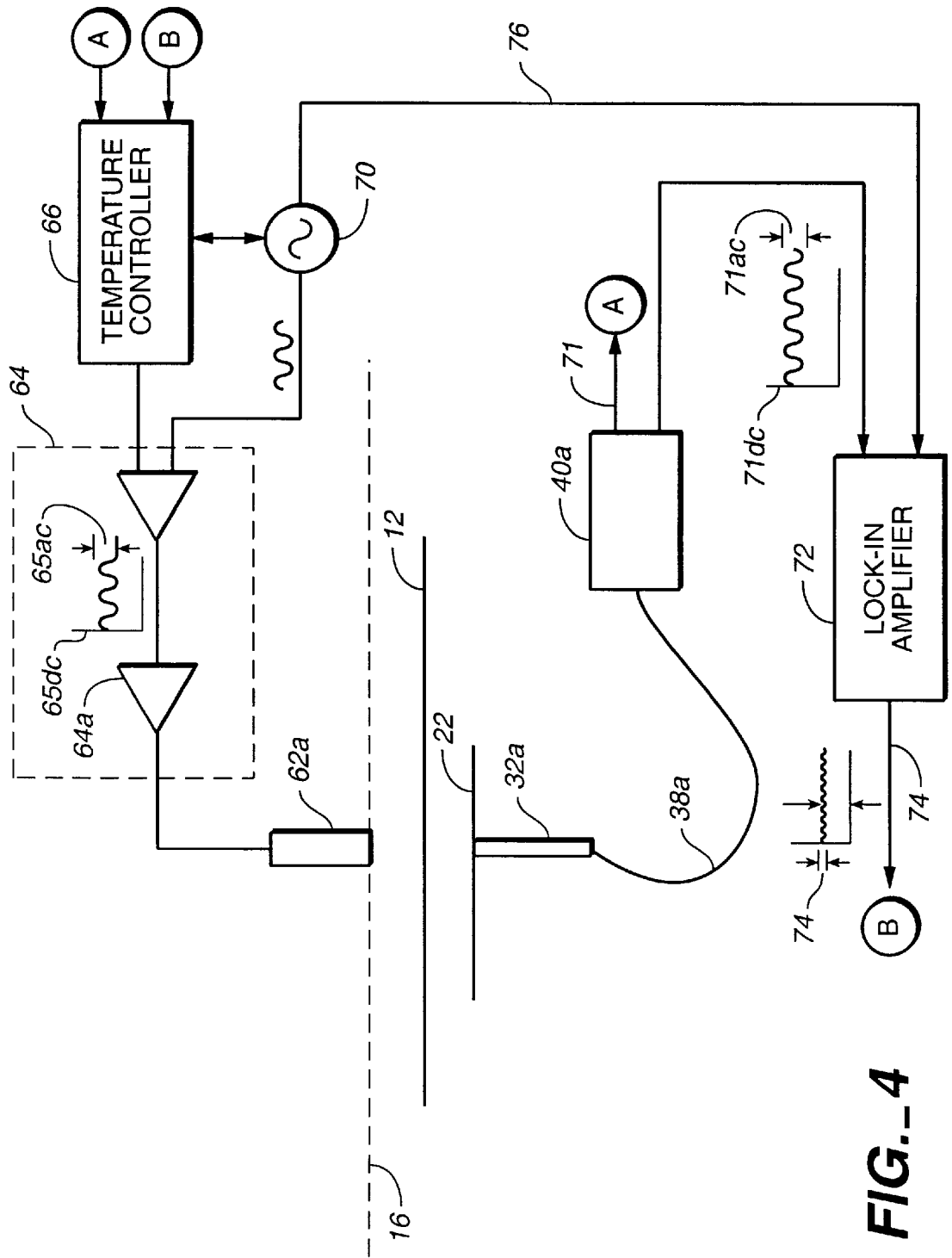
FIG._4

LOW TEMPERATURE CONTROL OF RAPID THERMAL PROCESSES

BACKGROUND OF THE INVENTION

The invention relates to semiconductor processing systems, and, in particular, to devices and methods for controlling rapid thermal process at low temperatures.

Some semiconductor fabrication processing techniques, such as rapid thermal processing (RTP), require control of the wafer substrate temperature. In one system, the temperature is monitored during an RTP process by measuring the black body radiation emitted from the back side of the wafer while the wafer is being heated by an array of lamps illuminating its front side with broad-band light. The wafer is also rotated at about 90 RPM during the process to improve uniformity. More than one backside emission detector is typically employed, with a central detector positioned on the central axis of the spinning wafer during processing. The detectors are sensitive to a narrow band (about 40 nm) of radiation at about 950 nm wavelength. They typically are effective for monitoring and controlling temperatures above about 300–325° C. Below that temperature there is an instrumentation cut-off because there is not enough emission from the wafer at the wavelength at which the detectors are sensitive to provide an accurate measurement. The wafer temperature is controlled by adjusting the illumination from the lamps with a feedback loop from at least one of the back side detectors. A description of an RTP system of this type is provided in co-owned U.S. Pat. No. 5,660,472, to Peuse et al., the entire disclosure of which is included herein by reference.

A problem can arise in the beginning of a heating cycle. Some wafer materials, such as undoped or lightly doped silicon, will transmit infrared radiation from the lamps at relatively low process temperatures that are above the cut-off temperature of the detectors. This transmitted radiation overwhelms the emitted blackbody radiation when the wafer is cold, rendering the monitor reading meaningless. As the wafer heats up, the wafer transparency diminishes and the blackbody radiation increases. Eventually, as the wafer becomes opaque, the blackbody radiation becomes the dominant portion of the detected signal. The temperature at which the wafer becomes opaque enough to not seriously disturb the temperature measurement and control will be about 500–800° C., depending upon the doping of the wafer.

It is important to know the emissivity of a black body to calculate the body's temperature from its emissions. One method of making corrections to the emissivity of the substrate is described in U.S. Pat. No. 5,660,472. Another system optically detects a 60 Hz signal in the lamp output to make an adjustment of the emissivity at high temperatures, after the substrate becomes opaque.

A wafer's low temperature transparency can be a serious problem for processes on bare wafers that have no metalization on them. The solution to this problem has been to heat the wafer in an open loop mode, at constant power, until the back side measurement passes a measured minimum $T_m$ and a subsequent threshold value $T_r$. Then the feedback loop is employed to control the temperature. The open loop method of heating is illustrated in FIG. 1. Even with this method, there is no accurate temperature measurement from the backside detector, and therefore no temperature control, until the wafer reaches a temperature at which it becomes substantially opaque.

For most RTP processes, however, the wafers will have patterns of oxides and metalizations on them that absorb or block the lamp illumination from being transmitted. There may be some transmission, but not to a large enough extent to seriously affect the temperature measurement and control. Because the illumination from the lamps is blocked from reaching the back side emission detectors, temperature control can be effective from lower temperatures, even down to a temperature at the sensitivity limit of the detectors.

In a typical RTP facility, a cassette of several wafers, for example 25 wafers, is processed as a group through a predetermined processing recipe. Periodically, for example, twice a day, the manufacturer will double check its processes to make sure all the processes are still running within statistical control. The manufacturer will do the check by running a so called monitor wafer through the process. A monitor wafer is typically bare on the top; it does not have a pattern of oxides and metalizations to block the lamp illumination. The monitor wafer goes through the same recipe as the product wafers. Afterward, the monitor wafer is examined. If the monitor wafer is not processed by the same recipe as the product wafers, then the monitor wafer can no longer be predictive of the actual process at these low temperatures. On the other hand, if the process is changed to accommodate the monitor wafers, then the process is less efficient than it would otherwise be with temperature control at lower temperatures. Lack of temperature control at low temperatures impacts throughput and impacts process control.

SUMMARY OF THE INVENTION

The invention provides a system that enables accurate temperature measurement and control in the cold part of a thermal processing cycle when a substrate may transmit some of the illumination from heating lamps. This is obtained employing existing back side blackbody radiation detector systems. The system enables a desired process temperature to be reached more efficiently than with prior methods, and allows temperature controlled processing at temperatures hundreds of degrees lower than could previously be employed.

According to one aspect of the invention, a method of processing a semiconductor substrate in a thermal processing chamber includes heating the substrate by applying power modulated with an AC component having selected characteristics to at least one lamp illuminating a front side of the substrate. The method further includes measuring radiation from a back side of the substrate, and determining a transmitted portion of the measured radiation that is transmitted through the substrate based upon the measured radiation and the selected characteristics. The selected characteristics include a selected frequency of AC modulation and a modulation constant indicative of the relative magnitudes of an AC power component and a DC power component of the applied power. Determining a transmitted portion includes using a lock-in technique to provide a lock-in signal indicative of a magnitude of an AC component of the measured radiation. The AC component corresponds directly to the percentage of light transmitted.

The method can further include providing an indicator of the temperature of the substrate based upon the magnitude of the lock-in signal, the magnitude of the measured signal, and the modulation constant. It may include controlling a process step based upon the transmitted portion of the measured radiation. Controlling the process step may be adjusting the heating, such as changing from open-loop heating to closed-loop temperature control. Controlling a process step can further include at least one of adjusting a gas flow and adjusting chemistry in the chamber. Controlling a process step can include determining the type of substrate in the chamber and adjusting another process step based on the determined type of substrate.

Heating the substrate can include applying power with an AC power component only to at least one lamp in a central zone centrally located with respect to the substrate. The central zone may include a lamp positioned on a rotation axis of the substrate. Measuring radiation in this case includes measuring radiation from the back side of the substrate with a sensor positioned on the rotation axis.

According to another aspect of the invention, an apparatus for processing a semiconductor substrate mounted in a thermal processing chamber includes a heating system for heating the substrate, which includes lamps facing a front side of the substrate and a power supply system providing power to at least one of the lamps with a DC power component and an AC power component at a selected frequency. The AC power component is a selected fraction of the DC power component. The apparatus also has a sensor facing a back side of the substrate for providing a detected signal indicative of measured radiation from the back side of the substrate. A lock-in system provides a lock-in signal indicative of a magnitude of an AC component of the detected signal at the selected frequency in response to the detected signal and a reference signal at the selected frequency. A processing system is adapted to determine a transmitted portion of the measured radiation that is transmitted through the substrate based upon the lock-in signal, the detected signal and the selected fraction.

The power supply system may be adapted to provide power with the AC power component only to at least one lamp located in a central zone of the heating system that is centrally located with respect to the substrate. The central zone may include a lamp positioned on a rotation axis of the substrate, and measuring radiation may include measuring radiation from the back side of the substrate with a sensor positioned on the rotation axis.

In other features, the processing system includes a temperature controller adapted to control the DC power component provided by the power supply system according to a desired temperature recipe. A signal generator provides a signal controlling the AC power component provided by the power supply system. The temperature controller can be adapted to control a process step for the substrate at substrate temperatures between about 300° C. and 700° C. when the substrate transmits more than about 1% of illumination from the lamps. The process step can include, for example, closed-loop temperature control of the substrate; determining the type of substrate in the chamber and adjusting another process step based on the determined type of substrate; adjusting a gas flow; and/or adjusting chemistry in the chamber.

According to yet another aspect of the invention, an apparatus for processing a semiconductor substrate in a thermal processing chamber includes a lamp facing a front side of the substrate, a lamp driver providing DC power to the lamp to heat the substrate, a signal generator providing AC power to the lamp at a selected frequency, wherein the AC power is a selected fraction of the DC power, a temperature sensor arranged to produce a sensor signal indicative of radiation emitted from the back side of the wafer, a lock-in amplifier having a reference input at the selected frequency and producing a lock-in signal indicative of an AC component of the emitted radiation in response to the sensor signal, and a controller programmed with a pre-defined temperature cycle recipe and controlling the DC power provided by the lamp driver according to a programmed temperature recipe and in response to the lock-in signal, the sensor signal, and the selected fraction.

In another aspect, the invention provides a method for processing a semiconductor substrate in a thermal processing chamber. This method includes illuminating a front side of the substrate with radiation modulated with an AC component characterized by a selected modulation frequency and a known modulation constant indicative of the relative magnitudes of the AC component and a DC component of the radiation, measuring radiation from a backside of the substrate, determining a magnitude of an AC component of the measured radiation, and determining the magnitude of radiation transmitted through the substrate based upon the measured radiation, the magnitude of the AC component of the measured radiation, and the modulation constant.

The system of the invention is insensitive to the type of substrate that is processed, which makes the process more robust. Although the system is particularly suited for wafers that transmit radiation in a frequency band to which a backside emission detector is sensitive, such as pure or lightly doped silicon, test wafers, monitor wafers, or product wafers that have no surface features on the top that absorb the light, heavily doped and metalized wafers can be processed equally well.

BRIEF DESCRIPTION OF THE DRAWING

FIG. 1 plots actual temperature (solid line) and measured temperature (dashed line) based on radiation detected by a back side detector as a function of time when a bare silicon wafer is heated by illuminating the wafer front side with heat lamps operating in an open-loop mode.

FIG. 2 is schematic sectional view of an RTP system according to the invention.

FIG. 3 is a schematic block diagram of a temperature control system for the RTP system of FIG. 2.

FIG. 4 is a schematic block diagram of a portion of the temperature control system illustrated in FIG. 3 for detecting transparency of a substrate, in which the power applied to one heating lamp is modulated with an AC component.

FIG. 5 is plot of illumination intensity as a function of time for the lamp illustrated in FIG. 4.

FIG. 6 is a plot of a detected radiation signal from a back side radiation sensor as a function of time for the system illustrated in FIG. 4.

DETAILED DESCRIPTION OF THE INVENTION

Referring to FIG. 2, a rapid thermal processing (RTP) system modified according to the invention includes a processing chamber 110 for processing a disk-shaped silicon substrate 12, or wafer. A complete description of an RTP system similar in most respects to that illustrated in FIG. 2 can be found in the previously mentioned U.S. Pat. No. 5,660,472, therefore this description will be somewhat abbreviated. It will be understood that the described system can be modified to process different size wafers.

Substrate 12 is mounted inside the chamber on a substrate support structure 14 and is heated by a heating element 16 located directly above substrate 12. Heating element 16 generates radiation 18 which enters the processing chamber via a water-cooled quartz window assembly 20 which is approximately one inch (2.5 cm) above the substrate.

Beneath substrate 12 is a reflector 22, which is mounted on a water-cooled, stainless steel base 24, which has passages 25 for cooling water. Reflector 22 is made of aluminum and has a highly reflective surface coating 26. The underside of substrate 12 and the top of reflector 22 form a reflecting cavity 28 for enhancing the effective emissivity of the substrate.

The temperatures at localized regions 30 of substrate 12 are measured by a plurality of temperature probes 32, 32a (only three of which are shown in FIG. 2). Temperature probes 32, 32a are sapphire light pipes that pass through respective conduits 34, 34a that extend from the backside of base 24 through the top of reflector 22. Small reflective cavities 36, 36a (i.e. microcavities) may be formed in the top surface of reflector 22 where the conduits pass through to the top of reflector 22. Each conduit 34, 34a enters its respective small cavity 36, 36a forming an aperture at the bottom of the small cavity 36, 36a. Sapphire light pipes 32, 32a are positioned within respective conduits 34, 34a so that their uppermost ends are flush with or slightly below the bottom of microcavities 36, 36a. The other end of each light pipe 32, 32a couples to a flexible optical fiber 38, 38a that transmits sampled light from the cavity to a pyrometer 40, 40a.

Although only three measurement probes are shown in FIG. 2, it should be understood that several measurement probes are distributed over reflector 22 to measure black body emissions at different radii. One probe, 32a, is positioned on center. During processing, support structure 14 is rotated at about 90 RPM. Thus, each probe 32 other than center probe 32a samples the temperature profile of a corresponding annular ring area on substrate 12.

The support structure that rotates substrate 12 includes a support ring 42 that contacts substrate 12 about its outer perimeter, leaving all of the underside exposed except for a small annular region about the perimeter. Support ring 42 rests on a rotatable tubular quartz cylinder 44 coated with silicon or silicon nitride to render it opaque in the frequency range of pyrometers 40, 40a. The coating acts as a baffle to block outside radiation from entering cavity 118. The bottom of quartz cylinder 44 is held by an annular upper bearing race 46, which rests on a plurality of ball bearings 48 that are held, in turn, within a stationary, annular, lower bearing race 50. Upper bearing race 46 is magnetically coupled to an actuator (not shown) which rotates cylinder 44, support ring 42 and substrate 12.

A purge ring 52 that is fitted into the chamber body surrounds quartz cylinder 44. Purge ring 52 has an internal annular cavity 54 which opens up to a region 56 above upper bearing race 46 and is also connected to a purge gas supply (not shown) through a passageway 58. Thus, during processing a purge gas can flow into the chamber through purge ring 52.

Referring now also to FIG. 3, heating element 16 includes an array of light pipes 60 to deliver highly collimated light from tungsten-halogen lamps 62 to processing chamber 10. A suitable heating element 16 is described in U.S. Pat. No. 5,155,336, the entire disclosure of which is included herein by reference. Lamps are divided into zones which are located in a radially symmetric manner. The number of lamps and zones will depend on the size of the wafer being processed. In a system for processing eight inch (200 mm) wafers, 187 lamps 62 are arrayed in twelve zones. Each zone is separately powered by a multi-zone lamp driver 64, that is, in turn, controlled by a multi-input, multi-output programmable controller 66.

FIG. 3 also shows a control loop for heating substrate 12 to a desired temperature. The sampled output of temperature sensors, which include pyrometers 40, 40a and light pipes 32, 32a, is input to controller 66. Controller 66 corrects the temperatures based upon a desired temperature recipe 68 by adjusting the power level of the heating lamps 62.

As described above, at very low temperatures, below about 300–325° C., there is insufficient black body radiation from substrate 12 to provide a signal from which pyrometers 40, 40a can produce an accurate measurement. At higher temperatures, between the low temperature sensitivity cut-off for the pyrometers 40, 40a and a temperature at which substrate 12 becomes opaque, light transmitted through substrate 12 prevents accurate temperature sensing.

Therefore, according to the invention the DC power applied to one or more lamps 62 is modulated with an AC signal from a signal generator 70. The AC signal is added to the temperature controller signal before the multi-zone lamp driver 64. The frequency of the AC signal is chosen for optimum response based upon the temperature measurement sampling frequency. The AC component is detected using a standard lock-in detection technique and is converted to an amplitude, which represents the amount of lamp radiation transmitted by the wafer. This transmitted amplitude is used by controller 66 to recognize the type of wafer present in chamber 10. Controller 66 can then adjust or select the desired temperature recipe 68 accordingly for processing.

Referring now also to FIG. 4, a lamp 62a that is centrally located on the rotation axis of substrate 12 is powered by a central zone driver 64a in multi-zone lamp driver 64. Central zone driver 64a provides a signal to lamp 62a with a DC power component 65dc and an AC power component 65ac so that lamp 62a produces illumination I having a DC magnitude and an AC magnitude at a selected frequency (FIG. 5). The AC magnitude, indicated by $I_{ac}$, is a selected fraction k of the peak power magnitude $I_p$, i.e $I_{ac}=kI_p$. The AC component is provided by signal generator 70; the DC component is from temperature controller 66. Temperature controller 66 can also be used to control signal generator 70 and/or to monitor the output of signal generator 70.

Centrally located light pipe 32a facing the back side of substrate 12 transmits light from the substrate back side to pyrometer 40a. Pyrometer 40a provides a detected signal 71 having a magnitude D that is indicative of an emission magnitude of light emitted from the back side of substrate 12 and the magnitude of light transmitted through substrate 12. Detected signal 71 is transmitted to temperature controller 66 along with detected signals from other pyrometers 32.

Referring now also to FIG. 6, detected signal 71 includes a DC component, d, and an AC component, a, at the selected frequency. A portion, e, of signal 71 is due to black body emission from substrate 12. The remainder of signal 71, including AC component a, is due to transmission through substrate 12. The DC component of the transmitted signal is indicated with the letter b. The total transmitted signal (a+b) is indicated by the letter T.

Referring back to FIG. 4, detected signal 71 is also transmitted to a lock-in amplifier 72. Lock-in amplifier 72 provides a lock-in signal 74 indicative of a, which is the magnitude of the AC component of the detected signal 71, based upon the detected signal 71 and a reference signal 76 at the selected frequency from signal generator 70. It is known that the ratio of a to T is the same as the ratio of $I_{ac}$ to $I_p$. Therefore, a=kT=k(a+b). The DC component of the transmitted signal, b, can be calculated from this to be b=(a/k)(1−k). We subtract the transmitted signal T=a+b from the magnitude D of detected signal 71 to obtain the magnitude of the emission signal:

$$e = D - T = D - (a/k)(1-k^2)$$

Thus, temperature controller 66 can be programmed to calculate e directly from signals 71 and 74. The emission signal magnitude e provides an accurate indication of the temperature of substrate 12 to temperatures as low as the cut-off temperature of the pyrometers. In this way, the substrate temperature can be monitored directly. This calculated information can also be used to make corrections to signals from other pyrometers 40 which do not have an AC modulation. This allows accurate, closed-loop temperature control according to a desired temperature recipe to temperatures well below what was previously achievable.

As mentioned above, this information can also be used to determine the type of substrate being processed because substrates with different doping or surface layers have different transmittance properties at a given temperature. With the transmittance information, temperature controller 66 can be programmed to go to a look-up table to select a desired temperature recipe 68 that is appropriate for that substrate.

When the system is in open loop control, the power settings are determined by a recipe setting that the user inputs in the system. The temperature is monitored, but it is not used to control the power settings. With the accurate temperature information provided by this system, temperature controller 66 can be programmed to make a decision as to whether the open-loop power setting are appropriate and change them, to make the initial warm-up time very consistent regardless of wafer type.

The information obtained by the described method can be used for controlling process steps other than temperature control, such as controlling gas flows and/or chemistry in chamber 10.

The AC signal provided by signal generator 70 may be a sine wave, a square wave, a sawtooth wave, or any other type of AC signal. However, a sine wave is preferred because it is the simplest signal for a lock-in amplifier to detect. The selected frequency is chosen to avoid interference from line frequency (60 Hz) and also to minimize interference from the rotation speed of substrate (90 RPM) and its harmonics. One also cannot use a frequency with a period that is shorter than the response time of pyrometer 32a, which is about 0.05 seconds. The selected frequency therefore should be greater than the rotation frequency (1.5 Hz), and less than the 20 hertz sampling frequency of our temperature measurement system. A frequency in the range of about 2–10 Hz is acceptable for the AC component.

The selected fraction k is determined empirically. The AC illumination signal must be large enough that the transmitted ac signal can be detected easily, even when there is only a small amount of transmission through substrate 12. At some point, it becomes irrelevant how little transmission there is. It is estimated that the lock-in measurement will not be essential when the transmitted signal is less than 1% of the detected signal. Therefore, k is chosen to be just large enough so that the modulation signal can be seen with the lock-in system if there is a 1% transmittance. If k is much larger, it would affect the light output of the lamp and the temperature in that zone would be affected.

It will be understood that the selected modulation constant k is arbitrarily chosen as the ratio of the ac peak-to-peak magnitude to the total peak power for illumination. k may as easily be chosen to be the ratio of the ac magnitude to the dc magnitude, with a corresponding alteration of the algebraic relations discribed above. The important feature of the modulation constant k is that it is indicative of a known relationship between the ac illumination and the dc illumination.

The central zone is preferred because it has absolutely minimal affect on temperature control to begin with. The central zone also has a probe right under it, so it provides the simplest way to make the measurement. Although FIG. 4 shows only a single lamp being AC modulated, the central zone may include more than one lamp. In that case, all the lamps in the central zone would be modulated. The central zone is also preferred because it has virtually zero rotation component. Because substrate 12 rotates in the chamber not all parts of substrate are at exactly equal temperatures. The outer temperature zones have a rotation component at about 1.5 Hz which is caused by the hotter and colder spots moving past the probes.

Pyrometers that are sensitive to light of a frequency band different from that in the described system may be used. Other types of light detectors than pyrometers may also be used without departing from the scope of the invention. Using such other pyrometers or light detectors may affect the selected frequency and AC modulation magnitude, and may also affect the cut-off temperature of the light detector.

Other embodiments are within the scope of the following claims.

What is claimed is:

1. A method of processing a semiconductor substrate in a thermal processing chamber, comprising:

heating the substrate, including applying power modulated with an AC component having selected characteristics to at least one lamp illuminating a front side of the substrate;

measuring radiation from a back side of the substrate; and determining a transmitted portion of the measured radiation that is transmitted through the substrate based upon the measured radiation and the selected characteristics.

2. The method of claim 1, wherein the selected characteristics include a selected frequency of AC modulation and a modulation constant indicative of the relative magnitudes of an AC power component and a DC power component of the applied power.

3. The method of claim 2, wherein determining a transmitted portion includes using a lock-in technique to provide a lock-in signal indicative of a magnitude of an AC component of the measured radiation.

4. The method of claim 3, further including providing an indicator of the temperature of the substrate based upon the magnitude of the lock-in signal, the magnitude of the measured signal, and the modulation constant.

5. The method of claim 3, further comprising controlling a process step based upon the transmitted portion of the measured radiation.

6. The method of claim 3, wherein controlling a process step includes adjusting the heating.

7. The method of claim 6, wherein controlling a process step further includes changing from open-loop heating to closed-loop temperature control.

8. The method of claim 5, wherein controlling a process step further includes at least one of adjusting a gas flow and adjusting chemistry in the chamber.

9. The method of claim 5, wherein controlling a process step includes determining the type of substrate in the chamber and adjusting another process step based on the determined type of substrate.

10. The method of claim 3, wherein heating the substrate includes applying power with an AC power component only to at least one lamp in a central zone centrally located with respect to the substrate.

11. The method of claim 10, wherein the central zone includes a lamp positioned on a rotation axis of the substrate, and wherein measuring radiation includes measuring radiation from the back side of the substrate with a sensor positioned on the rotation axis.

12. An apparatus for processing a semiconductor substrate mounted in a thermal processing chamber, comprising:
- a heating system for heating the substrate, including lamps facing a front side of the substrate and a power supply system providing power to at least one of the lamps with a DC power component and an AC power component at a selected frequency, wherein the AC power component is a selected fraction of the DC power component;
- a sensor facing a back side of the substrate for providing a detected signal indicative of measured radiation from the back side of the substrate;
- a lock-in system that provides a lock-in signal indicative of a magnitude of an AC component of the detected signal at the selected frequency in response to the detected signal and a reference signal at the selected frequency; and
- a processing system adapted to determine a transmitted portion of the measured radiation that is transmitted through the substrate based upon the lock-in signal, the detected signal and the selected fraction.

13. The apparatus of claim 12, wherein the power supply system is adapted to provide power with the AC power component only to at least one lamp located in a central zone of the heating system that is centrally located with respect to the substrate.

14. The apparatus of claim 13, wherein the central zone includes a lamp positioned on a rotation axis of the substrate, and wherein measuring radiation includes measuring radiation from the back side of the substrate with a sensor positioned on the rotation axis.

15. The apparatus of claim 12, wherein the processing system includes a temperature controller adapted to control the DC power component provided by the power supply system according to a desired temperature recipe, and wherein a signal generator provides a signal controlling the AC power component provided by the power supply system.

16. The apparatus of claim 15, wherein the temperature controller is adapted to control a process step for the substrate at substrate temperatures between about 300° C. and 700° C. when the substrate transmits more than about 1% of illumination from the lamps.

17. The apparatus of claim 16, wherein the process step includes closed-loop temperature control of the substrate.

18. The apparatus of claim 16, wherein the process step includes determining the type of substrate in the chamber and adjusting another process step based on the determined type of substrate.

19. The apparatus of claim 16, wherein the process step includes at least one of adjusting a gas flow and adjusting chemistry in the chamber.

20. An apparatus for processing a semiconductor substrate in a thermal processing chamber, comprising:
- a lamp facing a front side of the substrate;
- a lamp driver providing DC power to the lamp to heat the substrate;
- a signal generator providing AC power to the lamp at a selected frequency, wherein the AC power is a selected fraction of the DC power;
- a temperature sensor arranged to produce a sensor signal indicative of radiation emitted from the back side of the substrate;
- a lock-in amplifier having a reference input at the selected frequency and producing a lock-in signal indicative of an AC component of the emitted radiation in response to the sensor signal; and
- a controller programmed with a predefined temperature cycle recipe and controlling the DC power provided by the lamp driver according to a programmed temperature recipe and in response to the lock-in signal, the sensor signal, and the selected fraction.

21. A method for processing a semiconductor substrate in a thermal processing chamber, comprising:
- illuminating a front side of the substrate with radiation modulated with an AC component characterized by a selected modulation frequency and a known modulation constant indicative of the relative magnitudes of the AC component and a DC component of the radiation;
- measuring radiation from a backside of the substrate;
- determining a magnitude of an AC component of the measured radiation; and
- determining the magnitude of radiation transmitted through the substrate based upon the measured radiation, the magnitude of the AC component of the measured radiation, and the modulation constant.

* * * * *